United States Patent
Yang et al.

(10) Patent No.: US 12,267,041 B2
(45) Date of Patent: Apr. 1, 2025

(54) POWER ELECTRONIC DEVICE ON DIRECT-CURRENT SIDE OF PHOTOVOLTAIC SYSTEM, AND TEST SYSTEM AND CONTROL METHOD THEREFOR

(71) Applicant: Sungrow Power Supply Co., Ltd., Hefei (CN)

(72) Inventors: Yu Yang, Hefei (CN); Qiaodi Chen, Hefei (CN); Yuqi Peng, Hefei (CN); Jun Xu, Hefei (CN)

(73) Assignee: Sungrow Power Supply Co., Ltd., Hefei (CN)

( * ) Notice: Subject to any disclaimer, the term of this patent is extended or adjusted under 35 U.S.C. 154(b) by 159 days.

(21) Appl. No.: 17/921,950

(22) PCT Filed: Oct. 30, 2020

(86) PCT No.: PCT/CN2020/125107
§ 371 (c)(1),
(2) Date: Oct. 27, 2022

(87) PCT Pub. No.: WO2022/032884
PCT Pub. Date: Feb. 17, 2022

(65) Prior Publication Data
US 2023/0179146 A1      Jun. 8, 2023

(30) Foreign Application Priority Data
Aug. 12, 2020   (CN) .......................... 202010806655.3

(51) Int. Cl.
*H02S 50/10*   (2014.01)
*H02J 1/10*    (2006.01)

(52) U.S. Cl.
CPC .............. *H02S 50/10* (2014.12); *H02J 1/102* (2013.01); *H02J 2300/24* (2020.01)

(58) Field of Classification Search
USPC ................................................... 324/761.01
See application file for complete search history.

(56) References Cited

U.S. PATENT DOCUMENTS 12,068,806 B2 *   8/2024   Shui ........................ H04B 3/58
2014/0191589 A1   7/2014   Friebe et al.
(Continued)

FOREIGN PATENT DOCUMENTS

| CN | 103078316 A | 5/2013 |
| CN | 203164323 U | 8/2013 |

(Continued)

OTHER PUBLICATIONS

First Examination Report for Australian Patent Application No. 2020462838, dated Jul. 25, 2023.
(Continued)

*Primary Examiner* — Farhana A Hoque
(74) *Attorney, Agent, or Firm* — Wolf, Greenfield & Sacks, P.C.

(57) ABSTRACT

A power electronic device on a direct-current side of a photovoltaic system, and a test system and a control method therefor, achieving a simple, fast, and low-cost functional test on the power electronic device during a production process or a troubleshooting process of the power electronic device on the direct-current side of the photovoltaic system. The power electronic device is used for detecting a fluctuation of an electric signal parameter of an input end of the power electronic device; when the fluctuation meets a preset condition, the device is switched from a limited output state to a non-limited output state; the fluctuation of the electric signal parameter of the input end is generated by applying a disturbance to the input end of the power electronic device on the direct-current side of the photovoltaic system by a direct-current power supply having a disturbance output.

14 Claims, 4 Drawing Sheets

(56) References Cited

U.S. PATENT DOCUMENTS

| | | | |
|---|---|---|---|
| 2018/0234051 A1 | 8/2018 | Ni et al. | |
| 2018/0248513 A1 | 8/2018 | Hoft | |
| 2019/0027617 A1 | 1/2019 | Varlan et al. | |
| 2019/0131793 A1* | 5/2019 | Wang | H01L 31/042 |
| 2021/0311130 A1 | 10/2021 | Wallisch et al. | |

FOREIGN PATENT DOCUMENTS

| | | |
|---|---|---|
| CN | 103592528 A | 2/2014 |
| CN | 104065336 A | 9/2014 |
| CN | 106877311 A | 6/2017 |
| CN | 108054998 A | 5/2018 |
| CN | 108832893 A | 11/2018 |
| CN | 109088431 A | 12/2018 |
| CN | 109150099 A | 1/2019 |
| CN | 109617523 A | 4/2019 |
| CN | 109713710 A | 5/2019 |
| CN | 110417351 A | 11/2019 |
| CN | 106992554 B | 2/2020 |
| CN | 110957760 A | 4/2020 |
| CN | 111208377 A | 5/2020 |
| CN | 111478290 A | 7/2020 |
| DE | 10 2011 053 524 A1 | 3/2013 |
| EP | 3 633 817 A1 | 4/2020 |
| JP | 2019-198204 A | 11/2019 |
| JP | 2020-054194 A | 4/2020 |
| WO | WO 2017/062914 A1 | 4/2017 |
| WO | WO 2019/127022 A1 | 7/2019 |

OTHER PUBLICATIONS

International Search Report and Written Opinion for International Application No. PCT/CN2020/125107, mailed Apr. 8, 2021.
Extended European Search Report for European Application No. 20949378.2, dated Sep. 10, 2024.

* cited by examiner

POWER ELECTRONIC DEVICE ON DIRECT-CURRENT SIDE OF PHOTOVOLTAIC SYSTEM, AND TEST SYSTEM AND CONTROL METHOD THEREFOR

This application is a national stage filing under 35 U.S.C. § 371 of International Patent Application Serial No. PCT/CN2020/125107, filed Oct. 30, 2020, which claims priority to Chinese Patent Application No. 202010806655.3, titled "POWER ELECTRONIC DEVICE ON DIRECT-CURRENT SIDE OF PHOTOVOLTAIC SYSTEM, AND TEST SYSTEM AND CONTROL METHOD THEREFOR", filed on Aug. 12, 2020 with the China National Intellectual Property Administration. The contents of these applications are incorporated herein by reference in their entireties.

FIELD

The present disclosure relates to the technical field of power electronic, and in particular to a power electronic device on a direct-current side of a photovoltaic system, a system for testing the power electronic device on a direct-current side of a photovoltaic system, and a method for controlling the power electronic device on a direct-current side of a photovoltaic system.

BACKGROUND

A power electronic device on a direct-current side of a photovoltaic system includes but is not limited to a photovoltaic optimizer, a photovoltaic breaker, and an energy storage controller. For safety reasons, the power electronic device is in a limited output state (also referred to as a shutdown state) by default after powered on, having a low or zero output voltage. In a process of production or troubleshooting for the power electronic device, it is necessary to perform functional tests (such as pre-delivery tests or aging tests) for many times to determine whether the device functions well. The device is required to be in a non-limited output state (also referred to as an active state) during the functional tests.

According a conventional technology, a power electronic device on a direct-current side of a photovoltaic system to be tested is generally switched from the limited output state to the non-limited output state by transmitting a turn-on signal to the power electronic device through a communication manner. However, such method may need addition of a peripheral communication device, resulting in an increased cost in device production and an increased workload for on-site troubleshooting.

SUMMARY

In view of the above, the present disclosure provides a power electronic device on a direct-current side of a photovoltaic system, a system for testing the power electronic device on a direct-current side of a photovoltaic system, and a method for controlling the power electronic device on a direct-current side of a photovoltaic system, to realize a simple, fast and low-cost functional testing on the power electronic device during a process of production or troubleshooting.

A power electronic device on a direct-current side of a photovoltaic system is provided. The power electronic device is configured to: detect a fluctuation of an electrical signal parameter at an input terminal of the power electronic device; and switch, in response to the fluctuation meeting a preset condition, from a limited output state to a non-limited output state. The fluctuation of the electrical signal parameter at the input terminal of the power electronic device is generated by disturbance applied to the input terminal of the power electronic device by a direct-current power supply with disturbance output.

In an embodiment, the electrical signal parameter is voltage, no-load current, or power.

In an embodiment, the power electronic device is specifically configured to: detect the fluctuation of the electrical signal parameter at the input terminal of the power electronic device; and switch, in response to the electrical signal parameter at the input terminal subjecting to an abrupt change to a preset range, from the limited output state to the non-limited output state.

In an embodiment, the power electronic device is specifically configured to: detect the fluctuation of the electrical signal parameter at the input terminal of the power electronic device; and switch, in response to the fluctuation of the electrical signal parameter at the input terminal being in accordance with a preset pattern, from the limited output state to the non-limited output state.

In an embodiment, the power electronic device is a photovoltaic breaker including a semiconductor switch and a diode. A power input terminal of the semiconductor switch serves as a positive input terminal of the photovoltaic breaker. A power output terminal of the semiconductor switch is connected to an anode of the diode and serves as a positive output terminal of the photovoltaic breaker. A cathode of the diode serves as a negative input terminal of the photovoltaic breaker and a negative output terminal of the photovoltaic breaker. The semiconductor switch is in a turned off state under the limited output state. The semiconductor switch is in a turned on state under the non-limited output state.

In an embodiment, the power electronic device is a photovoltaic optimizer including semiconductor switches Q1, Q2, Q3 and Q4, an inductance L, a capacitor C1, and a capacitor C2. The capacitor C1 is connected to input ports of the photovoltaic optimizer in parallel. The capacitor C2 is connected to output ports of the photovoltaic optimizer in parallel. A power input terminal of the semiconductor switch Q1 is connected to a positive input terminal of the photovoltaic optimizer. A power output terminal of the semiconductor switch Q1 is connected to a power input terminal of the semiconductor switch Q2 and a terminal of the inductor L.

The other terminal of the inductor L is connected to a power input terminal of the semiconductor switch Q3 and a power output terminal of the semiconductor switch Q4. A power input terminal of the semiconductor switch Q4 is connected to a positive output terminal of the photovoltaic optimizer. A power output terminal of the semiconductor switch Q2 and a power output terminal of the semiconductor switch Q3 are connected to each other and are both connected to a negative input terminal of the photovoltaic optimizer and a negative output terminal of the photovoltaic optimizer. The semiconductor switches Q1, Q2, Q3 and Q4 are all in a turned off state under the limited output state. Under the non-limited output state, the semiconductor switches Q1 and Q4 are in a turn on state and the semiconductor switches Q2 and Q3 are in a turned off state.

A system for testing a power electronic device on a direct-current side of a photovoltaic system is provided. The system includes a DC power supply with disturbance output, a detection device, and the power electronic device on the direct-current side of the photovoltaic system as disclosed above. An input terminal of the power electronic device is connected to the direct-current power supply with disturbance output, and an output terminal of the power electronic device is connected to the detection device. The direct-current power supply with disturbance output is configured to apply disturbance to the input terminal of the power electronic device. The detection device is configured to detect an electrical signal parameter at the output terminal of the power electronic device.

In an embodiment, the detection device is a voltmeter, an oscilloscope, or a multi-meter.

In an embodiment, the direct-current power supply with disturbance output includes a voltage-stabilized direct-current power supply, a resistor, and a switching device. The voltage-stabilized direct-current power supply and the resistor are connected in series and are connected to the input terminal of the power electronic device, and the switching device is connected to two ends of the resistor in parallel.

In an embodiment, the switching device is a controllable switch or a manual switch.

In an embodiment, the direct-current power supply with disturbance output is a programmable direct-current power supply configured to output an electrical signal with a fluctuating electrical signal parameter by means of programming.

A method for controlling a power electronic device on a direct-current side of a photovoltaic system is provided. The method includes: detecting by the power electronic device, a fluctuation of an electrical signal parameter at an input terminal of the power electronic device; determining whether the fluctuation meets a preset condition; switching, in response to the fluctuation meeting the preset condition, the power electronic device from a limited output state to a non-limited output state. The fluctuation of the electrical signal parameter at the input terminal is generated by disturbance applied to the input terminal of the power electronic device by the direct-current power supply with disturbance output.

In an embodiment, the fluctuation meeting the preset condition is that the electrical signal parameter of the input terminal of the power electronic device subject to an abrupt change to a preset range.

In an embodiment, the fluctuation meeting the preset condition is that the fluctuation of the electrical signal parameter at the input terminal of the power electronic device is in accordance to a preset pattern.

As can be seen from the above technical solutions, based on the fact that the electrical signal parameter at the input terminal of the power electronic device is basically constant in a short period of time in a case that the input terminal of the power electronic device is connected to a voltage-stabilized direct-current power supply and the power electronic device is in a limited output state, disturbance is applied to the input terminal during a process of production or troubleshooting according to the embodiments of the present disclosure. That the fluctuation of the electrical signal parameter at the input terminal meets the preset condition serves as a command to instruct the power electronic device to switch from the limited output state to the non-limited output state, and the power electronic device switches from the limited output state to the non-limited output state in response to the command. After that, a production or testing personnel may directly detect the electrical signal parameter at the output terminal of the power electronic device by using the detection device, to determine whether the power electronic device functions well, thereby realizing a simpler, faster and low-cost functional testing on the power electronic device compared to the conventional technology.

BRIEF DESCRIPTION OF THE DRAWINGS

In order to more clearly illustrate the embodiments of the present disclosure or the technical solutions in the conventional technology, accompanying drawings used in the description of the embodiments or the conventional technology are introduced below. Apparently, the drawings in the following description are only some embodiments of the present disclosure, and those of ordinary skill in the art may obtain other drawings based on these drawings without any creative effort.

DETAILED DESCRIPTION

The technical solutions in the embodiments of the present disclosure are clearly and completely described below with reference to the drawings in the embodiments of the present disclosure. Apparently, the described embodiments are only a part of, rather than all of, the embodiments of the present disclosure. All other embodiments obtained by those of ordinary skill in the art based on the embodiments in the present disclosure without any creative effort shall fall within the protection scope of the present disclosure.

Figure 1:
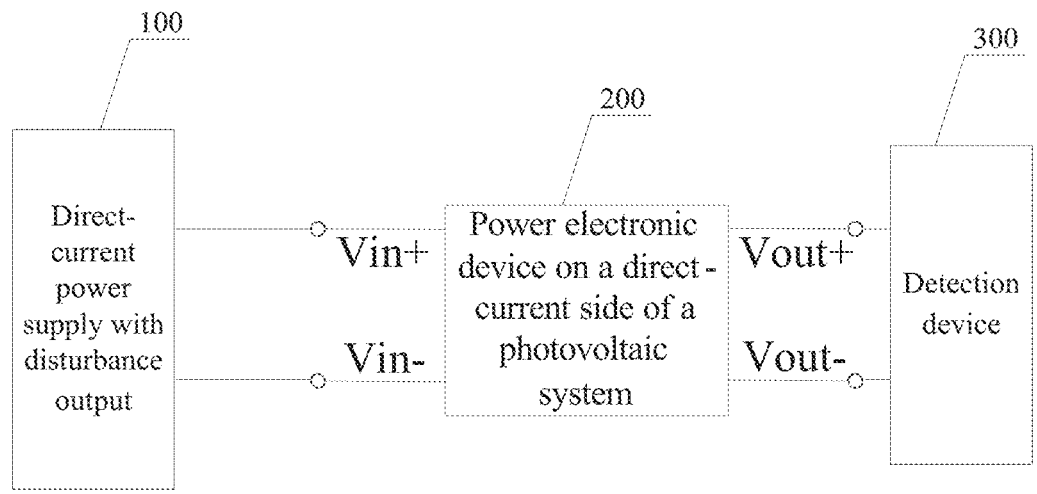
FIG. 1 is a schematic structural diagram of a system for testing a power electronic device on a direct-current side of a photovoltaic system according to an embodiment of the present disclosure.

As shown in FIG. 1, a system for testing a power electronic device on a direct-current side of a photovoltaic system is provided in an embodiment of the present disclosure. The system includes a detection device 300, a direct-current power supply 100 with disturbance output, and a power electronic device 200 on a direct-current side of a photovoltaic system to be tested.

The power electronic device on the direct-current side of the photovoltaic system has four terminals, i.e., a positive input terminal Vin+, a negative input terminal Vin−, a positive output terminal Vout+, and a negative output terminal Vout−.

The input terminals of the power electronic device 200 are connected to the direct-current power supply 100 with disturbance output; and the output terminals of the power electronic device 200 are connected to the detection device 300.

The direct-current power supply 100 with disturbance output is configured to apply disturbance to the input terminals of the power electronic device 200 on the direct-current side of the photovoltaic system.

The power electronic device 200 on the direct-current side of the photovoltaic system is configured to detect a fluctuation of an electrical signal parameter at an input terminal of the power electronic device, and switch, in a case that the fluctuation meets a preset condition, from a limited output state to a non-limited output state.

The detection device 300 is configured to detect the electrical signal parameter at an output terminal of the power electronic device 200, as a basis for determining whether the power electronic device 200 functions well.

Working principle of the embodiments of the present disclosure is as follows.

Figure 4:
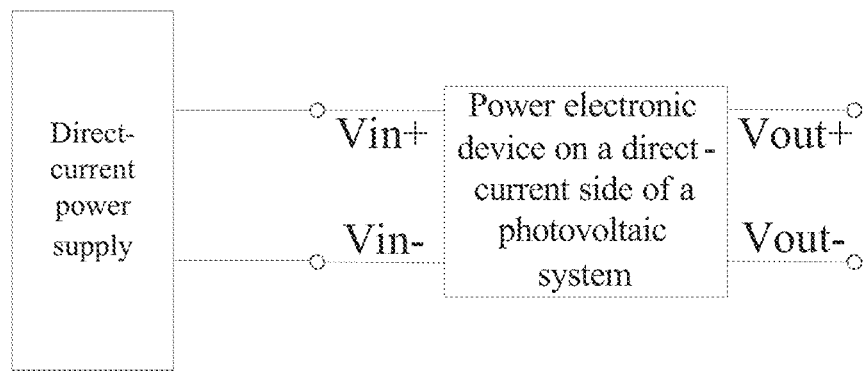
FIG. 4 is a schematic diagram of a power electronic device on a direct-current side of a photovoltaic system for which an output end circuit is open according to a conventional technology.

Under normal working conditions, an input terminal of the power electronic device is connected to a voltage-stabilized direct-current power supply, such as a photovoltaic module or battery. As shown in FIG. 4, in a case that the input terminal of the power electronic device is connected to the voltage-stabilized direct-current power supply and the power electronic device is in a limited output state (which is equivalent to that an output end circuit of the power electronic device is open), an output voltage of the voltage-stabilized direct-current power supply is basically constant in a short period of time, unless an intended operation. For example, in a case that the input terminal of the power electronic device is connected to a photovoltaic module and the power electronic device is in a limited output state, an output voltage of the photovoltaic module changes with a light intensity and is basically constant in a short period of time, unless the light is intentionally blocked. In a case that the input terminal of the power electronic device is connected to a battery and the power electronic device is in a limited output state, a voltage of the battery changes slowly with electric quantity of the battery and is basically constant in a short period of time, unless intended intervention.

In addition, in a case that the input terminal of the power electronic device is connected to the voltage-stabilized direct-current power supply and the power electronic device is in a limited output state, other electrical signal parameters (such as no-load current and power) at the input terminal of the power electronic device are basically constant in a short period of time, unless intended intervention.

Based on the fact that an electrical signal parameter at an input terminal of the power electronic device is basically constant in a short period of time in a case that the input terminal of the power electronic device is connected to a voltage-stabilized direct-current power supply and the power electronic device is in a limited output state, disturbance is applied to the input terminal during a process of production or troubleshooting according to the embodiments of the present disclosure, resulting in a fluctuation of the electrical signal parameter at the input terminal. The power electronic device detects the fluctuation of the electrical signal parameter (such as a voltage, no-load current or power, which is not limited herein) at the input terminal, and switches, in a case that the fluctuation meet a preset condition, from the limited output state which is default when powered on to a non-limited output state, that is, that the fluctuation of the electrical signal parameter at the input terminal meeting the preset condition serves as a command to instruct the power electronic device to switch from the limited output state to the non-limited output state. After the power electronic device is switched to the non-limited output state, a production or testing personnel may directly detect the electrical signal parameter at an output terminal of the power electronic device by using the detection device 300, to determine whether the power electronic device functions well, thereby realizing a simpler, faster and low-cost functional testing on the power electronic device compared to the conventional technology.

The power electronic device on the direct-current side of the photovoltaic system to be tested may be a photovoltaic optimizer, a photovoltaic breaker, an energy storage controller, or the like.

Figure 2:
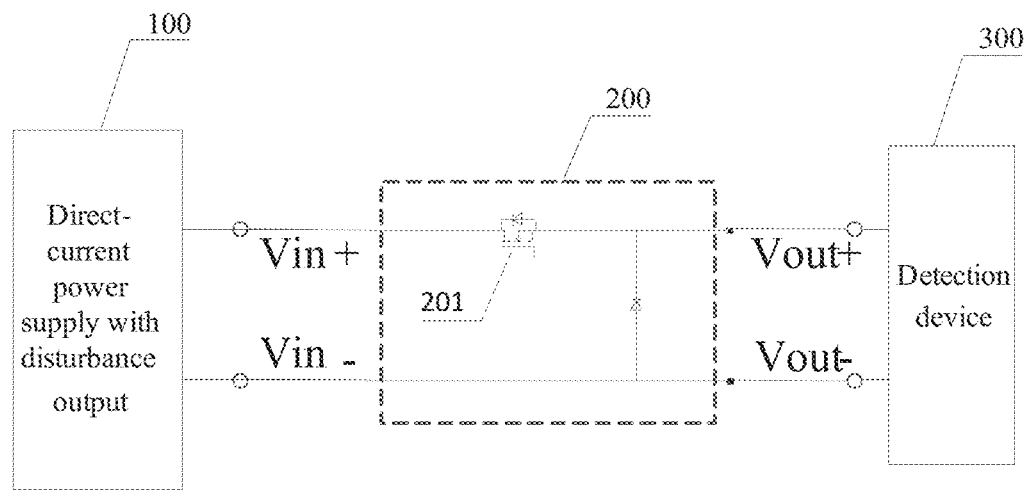
FIG. 2 is a schematic structural diagram of a system for testing a power electronic device on a direct-current side of a photovoltaic system in which the power electronic device is a photovoltaic breaker.

In a case that the power electronic device to be tested is a photovoltaic breaker, the photovoltaic breaker may have a circuit topology shown in FIG. 2 for example, including a semiconductor switch 201 and a diode. A power input terminal of the semiconductor switch 201 serves as a positive input terminal Vin+ of the photovoltaic breaker. A power output terminal of the semiconductor switch 201 is connected to an anode of the diode and serves as a positive output terminal Vout+ of the photovoltaic breaker. A cathode of the diode serves as a negative input terminal Vin− of the photovoltaic breaker and a negative output terminal Vout− of the photovoltaic breaker. The semiconductor switch 201 is in a turned off state under the limited output state, and is in a turned on state under the non-limited output state.

Figure 3:
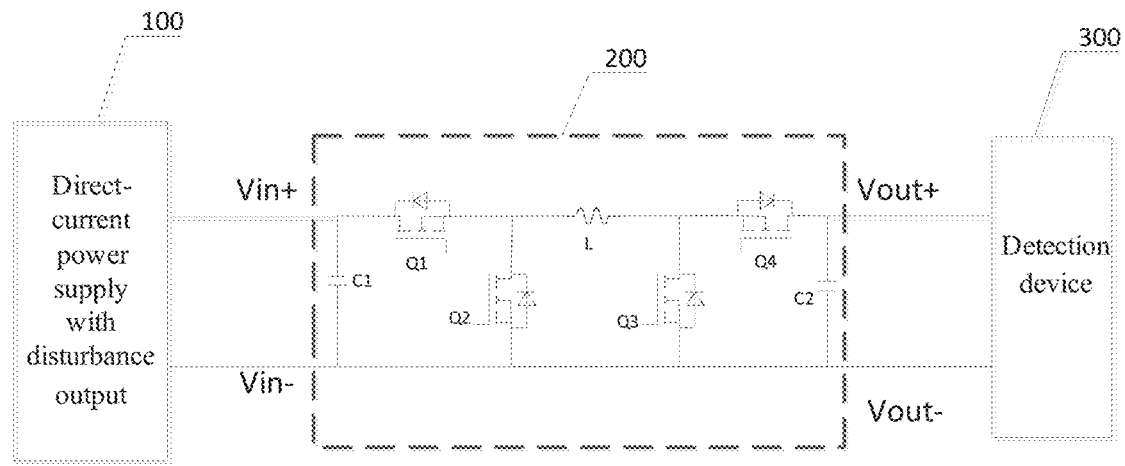
FIG. 3 is a schematic structural diagram of a system for testing a power electronic device on a direct-current side of a photovoltaic system in which the power electronic device is a photovoltaic optimizer.

In a case that the power electronic device to be tested is a photovoltaic optimizer, the photovoltaic optimizer may adopt a circuit topology shown in FIG. 3 for example, including: semiconductor switches Q1, Q2, Q3 and Q4, an inductance L, a capacitor C1, and a capacitor C2. The capacitor C1 is connected to input ports of the photovoltaic optimizer in parallel, and the capacitor C2 is connected to output ports of the photovoltaic optimizer in parallel. A power input terminal of the semiconductor switch Q1 is connected to a positive input terminal vin+ of the photovoltaic optimizer, and a power output terminal of the semiconductor switch Q1 is connected to a power input terminal of the semiconductor switch Q2 and a terminal of the inductor L. The other terminal of the inductor L is connected to a power input terminal of the semiconductor switch Q3 and a power output terminal of the semiconductor switch Q4. A power input terminal of the semiconductor switch Q4 is connected to a positive output terminal Vout+ of the photovoltaic optimizer. A power output terminal of the semiconductor switches Q2 and a power output terminal of the semiconductor switch Q3 are connected to each other and are both connected to a negative input terminal Vin− and a negative output terminal Vout− of the photovoltaic optimizer. The semiconductor switches Q1, Q2, Q3 and Q4 are all in a turned off state under the limited output state. Under the non-limited output state, the semiconductor switch Q1 and the semiconductor switch Q4 are in a turn on state, and the semiconductor switches Q2 and the semiconductor switch Q3 are in a turned off state.

FIG. 2 and FIG. 3 are provided in order to more clearly illustrate the present disclosure, rather than to limit the application scope of the present disclosure.

In an implementation, the detection device 30 may be a conventional voltmeter, a conventional oscilloscope, a conventional multi-meter, or the like, or may be a customized device, which is not limited herein.

Figure 5:
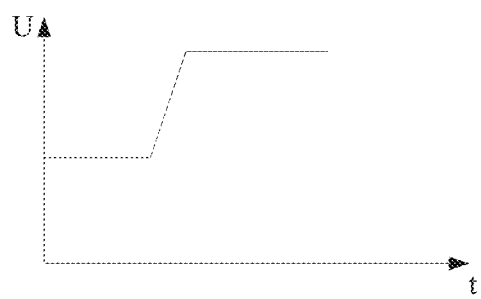
FIG. 5 is a schematic diagram showing a voltage fluctuation at an input terminal of a power electronic device on a direct-current side of a photovoltaic system according to an embodiment of the present disclosure.
Figure 6:
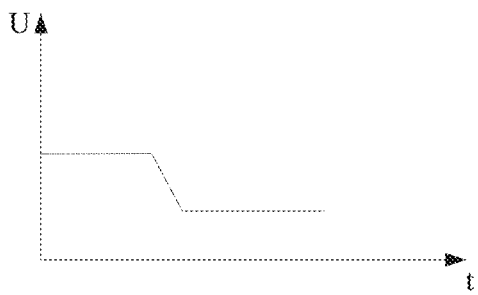
FIG. 6 is a schematic diagram showing a voltage fluctuation at an input terminal of a power electronic device on a direct-current side of a photovoltaic system according to another embodiment of the present disclosure.

In an implementation, in any of the above embodiments, that the fluctuation of an electrical signal parameter at the input terminal of the power electronic device meets a preset condition may be interpreted as that the electrical signal parameter at the input terminal of the power electronic device subjects to an abrupt change to a preset range (described herein taking a voltage as an example, as shown in FIG. 5 or FIG. 6, in which U represents a voltage and t represents a time instant). The abrupt change of the electrical signal parameter may refer to a sudden increase or a sudden drop of electrical signal parameter. FIG. 5 shows a sudden increase of voltage as an example, and FIG. 6 shows a sudden drop of voltage as an example.

Figure 7:
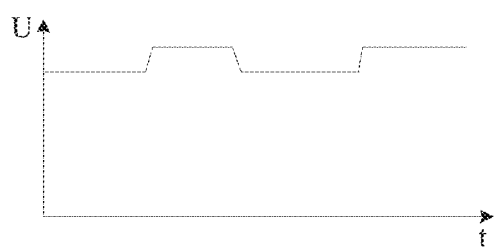
FIG. 7 is a schematic diagram showing a voltage fluctuation at an input terminal of a power electronic device on a direct-current side of a photovoltaic system according to yet another embodiment of the present disclosure.

In an implementation, that the fluctuation of an electrical signal parameter at the input terminal of the power electronic device meets a preset condition may be interpreted as that the fluctuation of the electrical signal parameter is in accordance with a preset pattern (described herein taking a voltage as an example, as shown in FIG. 7, in which U represents a voltage and t represents a time instant).

Figure 8:
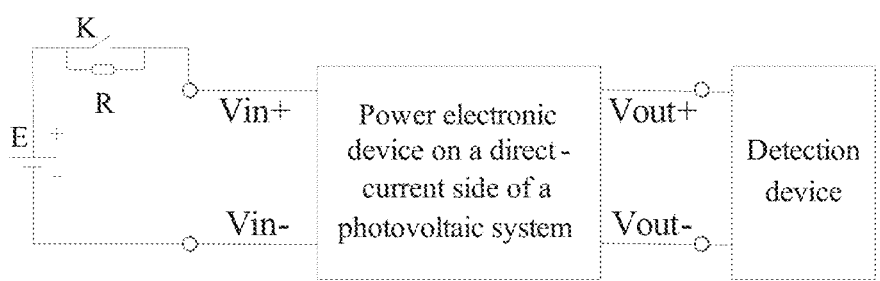
FIG. 8 is a schematic diagram showing a structure of a direct-current power supply with disturbance output adopted in the system shown in FIG. 1.

In the embodiments of the present disclosure, the direct-current power supply 100 with disturbance output is utilized to directly apply disturbance to the input terminal of the power electronic device on the direct-current of the photovoltaic system. In an example, the direct-current power supply 100 with disturbance output may have a structure as shown in FIG. 8, including: a voltage-stabilized direct-current power supply E, a resistor R and a switching device K. The voltage-stabilized direct-current power supply E and the resistor R are connected in series and are connected to the input terminal of the power electronic device. The switching device K is connected in parallel to two ends of the resistor R. The direct-current power supply 100 with disturbance output may cause fluctuation of an electrical signal parameter in response to an on/off action of the switching device K. The switching device K may be a controllable switch or a manual switch. The controllable switch may be, for example, a relay or a switch transistor, which is not limited herein.

Figure 9:
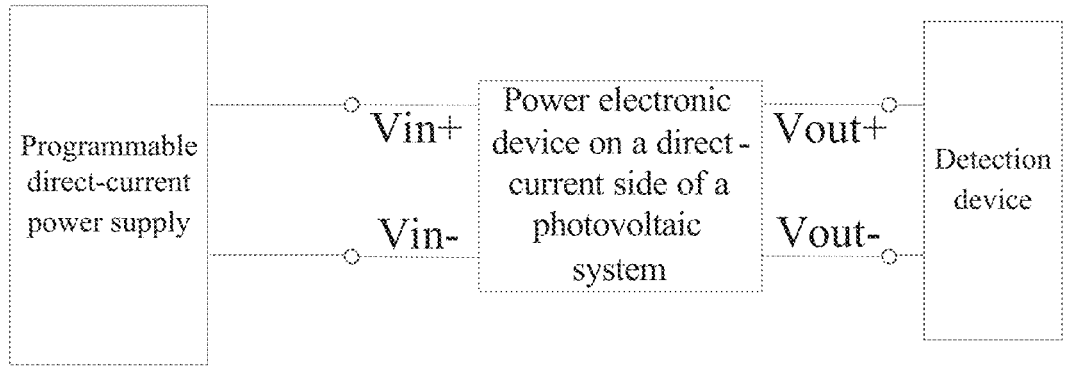
FIG. 9 is a schematic diagram showing a structure of another direct-current power supply with disturbance output adopted in the system shown in FIG. 1.

In any of the above embodiments, the direct-current power supply 100 with disturbance output may be implemented using a programmable direct-current power supply, which is configured to output a fluctuating electrical signal parameter by means of programming, as shown in FIG. 9.

Corresponding to the above system embodiment, a power electronic device on a direct-current side of a photovoltaic system is further provided in an embodiment of the present disclosure. The power electronic device is configured to: detect a fluctuation of an electrical signal parameter at an input terminal of the power electronic device; and switch, in a case that the fluctuation meets a preset condition, from a limited output state to a non-limited output state. The fluctuation of an electrical signal parameter at the input terminal of the power electronic device is generated by disturbance applied to the input terminal by a direct-current power supply with disturbance output. After the power electronic device switches to the non-limited output state, a staff may directly determine whether the power electronic device functions well based on the electrical signal parameter at the output terminal of the power electronic device, thereby realizing a functional test in a simpler, faster and low-cost manner.

In an embodiment, the electrical signal parameter is voltage, no-load current, or power.

In an embodiment, the power electronic device is specifically configured to: detect the fluctuation of the electrical signal parameter at the input terminal of the power electronic device, and switch, in a case that the electrical signal parameter subjects to an abrupt change to a preset range, from the limited output state to the non-limited output state.

In an embodiment, the power electronic device is specifically configured to: detect the fluctuation of the electrical signal parameter at the input terminal of the power electronic device, and switch, in a case that the fluctuation of the electrical signal parameter is in accordance with a preset pattern, from the limited output state to the non-limited output state.

Figure 10:
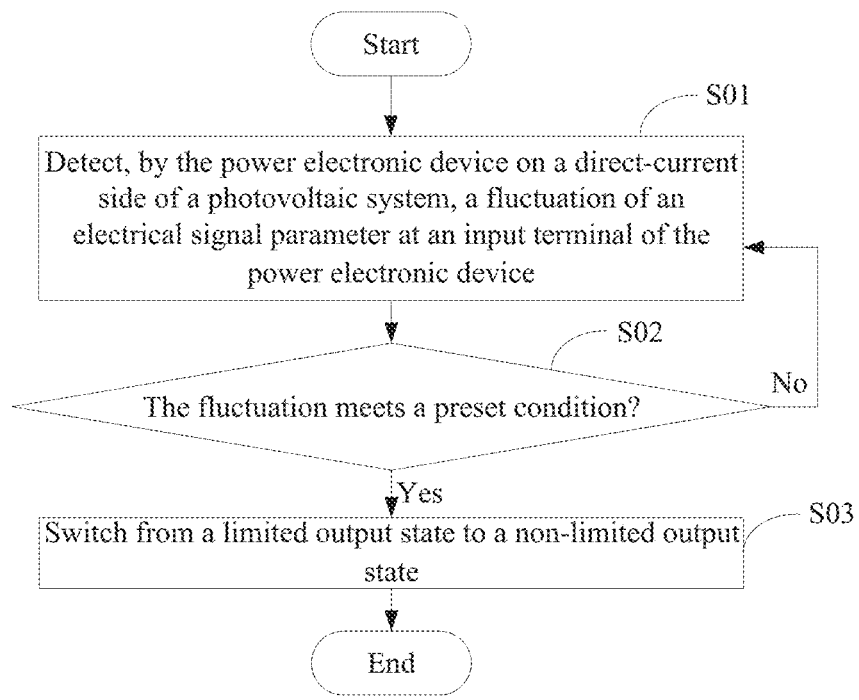
FIG. 10 is a flowchart of a method for controlling a power electronic device on a direct-current side of a photovoltaic system according to an embodiment of the present disclosure.

Corresponding to the device embodiments, a method for controlling a power electronic device on a direct-current side of a photovoltaic system is further provided in an embodiment of the present disclosure. As shown in FIG. 10, the method includes steps S01 to S03.

In step S01, an electrical signal parameter at an input terminal of the power electronic device is detected by the power electronic device. The method then proceeds to step S02.

In step S02, it is determined whether the fluctuation at the input terminal meets a preset condition. The method proceeds to step S03 in a case that the fluctuation meets the preset condition, or the method returns to step S01 in a case that the fluctuation does not meet the present condition. The fluctuation of the electrical signal parameter at the input terminal is generated by disturbance applied to the input terminal of the power electronic device by a direct-current power supply with disturbance output.

In step S03, the power electronic device is switched from a limited output state to a non-limited output state. Self-control of the power electronic device terminates after this step.

In an embodiment, that the fluctuation meets a preset condition refers to that the electrical signal parameter at the input terminal of the power electronic device subjects to an abrupt change to a preset range, or that the fluctuation of the electrical signal parameter at the input terminal of the power electronic device is in accordance with a preset pattern.

The device and the method provided in the present disclosure are described simply as they correspond to the system embodiments. Reference may be made to the description of the system for relevant information of the device and the method.

It may be further understood by those skilled in the art that examples of units and algorithm steps described in combination with the disclosed embodiments may be implemented by electronic hardware, computer software or a combination thereof. In order to clearly describe interchangeability of the hardware and the software, the examples are generally described above in view of their functions. Whether the functions being implemented by the hardware or by the software depends on applications of the technical solution and design constraint conditions. Those skilled in the art may use different methods for each particular application to implement the described functions, but such implementation should not be considered as going beyond the scope of the present disclosure.

Those of ordinary skill in the art can understand that all or part of the processes in the methods of the embodiments can be implemented by instructing relevant hardware through a computer program. The program may be stored in a computer-readable storage medium, and during execution, the program may include the processes of the method in the embodiments. The storage medium may be a magnetic disk, an optical disk, a read-only memory (ROM), a random access memory (RAM), or the like.

The description of the embodiments herein enables those skilled in the art to implement or use the present disclosure. Many modifications to these embodiments are apparent for those skilled in the art. The general principles defined herein may be applied to other embodiments without departing from the spirit or scope of the present disclosure. Therefore, the present disclosure is not limited to the embodiments illustrated herein, but is to conform to the widest scope consistent with the principles and novel features disclosed herein.

The invention claimed is:

1. A power electronic device on a direct-current side of a photovoltaic system, wherein the power electronic device is configured to:
   detect a fluctuation of an electrical signal parameter at an input terminal of the power electronic device; and
   switch, in response to the fluctuation meeting a preset condition, from a limited output state to a non-limited output state, wherein
   the fluctuation of the electrical signal parameter at the input terminal of the power electronic device is generated by disturbance applied to the input terminal of the power electronic device by a direct-current power supply with disturbance output.

2. The power electronic device according to claim 1, wherein the electrical signal parameter is voltage, no-load current, or power.

3. The power electronic device according to claim 1, wherein the power electronic device is configured to:
   detect the fluctuation of the electrical signal parameter at the input terminal of the power electronic device; and
   switch, in response to the electrical signal parameter at the input terminal subjecting to an abrupt change to a preset range, from the limited output state to the non-limited output state.

4. The power electronic device according to claim 1, wherein the power electronic device is configured to:
   detect the fluctuation of the electrical signal parameter at the input terminal of the power electronic device; and
   switch, in response to the fluctuation of the electrical signal parameter at the input terminal being in accordance with a preset pattern, from the limited output state to the non-limited output state.

5. The power electronic device according to claim 1, wherein the power electronic device is a photovoltaic breaker comprising a semiconductor switch and a diode, wherein
   a power input terminal of the semiconductor switch serves as a positive input terminal of the photovoltaic breaker,
   a power output terminal of the semiconductor switch is connected to an anode of the diode and serves as a positive output terminal of the photovoltaic breaker,
   a cathode of the diode serves as a negative input terminal of the photovoltaic breaker and a negative output terminal of the photovoltaic breaker;
   the semiconductor switch is in a turned off state under the limited output state; and
   the semiconductor switch is in a turned on state under the non-limited output state.

6. The power electronic device according to claim 1, wherein the power electronic device is a photovoltaic optimizer comprising semiconductor switches Q1, Q2, Q3 and Q4, an inductance L, a capacitor C1, and a capacitor C2, wherein
   the capacitor C1 is connected to input ports of the photovoltaic optimizer in parallel,
   the capacitor C2 is connected to output ports of the photovoltaic optimizer in parallel,
   a power input terminal of the semiconductor switch Q1 is connected to a positive input terminal of the photovoltaic optimizer,
   a power output terminal of the semiconductor switch Q1 is connected to a power input terminal of the semiconductor switch Q2 and a terminal of the inductor L,
   the other terminal of the inductor L is connected to a power input terminal of the semiconductor switch Q3 and a power output terminal of the semiconductor switch Q4,
   a power input terminal of the semiconductor switch Q4 is connected to a positive output terminal of the photovoltaic optimizer,
   a power output terminal of the semiconductor switch Q2 and a power output terminal of the semiconductor switch Q3 are connected to each other and are both connected to a negative input terminal of the photovoltaic optimizer and a negative output terminal of the photovoltaic optimizer; and
   the semiconductor switches Q1, Q2, Q3 and Q4 are all in a turned off state under the limited output state, and under the non-limited output state, the semiconductor switches Q1 and Q4 are in a turn on state and the semiconductor switches Q2 and Q3 are in a turned off state.

7. A system for testing a power electronic device on a direct-current side of a photovoltaic system, comprising: a direct-current power supply with disturbance output, a detection device, and the power electronic device on the direct-current side of the photovoltaic system according to claim 1; wherein
   an input terminal of the power electronic device is connected to the direct-current power supply with disturbance output, and an output terminal of the power electronic device is connected to the detection device;
   the direct-current power supply with disturbance output is configured to apply disturbance to the input terminal of the power electronic device; and
   the detection device is configured to detect an electrical signal parameter at the output terminal of the power electronic device.

8. The system according to claim 7, wherein the detection device is a voltmeter, an oscilloscope, or a multi-meter.

9. The system according to claim 7, wherein the direct-current power supply with disturbance output comprises: a voltage-stabilized direct-current power supply, a resistor, and a switching device; wherein
   the voltage-stabilized direct-current power supply and the resistor are connected in series and are connected to the input terminal of the power electronic device, and the switching device is connected to two ends of the resistor in parallel.

10. The system according to claim 9, wherein the switching device is a controllable switch or a manual switch.

11. The system according to claim 7, wherein the direct-current power supply with disturbance output is a programmable direct-current power supply configured to output a fluctuating electrical signal parameter by means of programming.

12. A method for controlling a power electronic device on a direct-current side of a photovoltaic system, comprising:
  detecting, by the power electronic device, a fluctuation of an electrical signal parameter at an input terminal of the power electronic device;
  determining whether the fluctuation meets a preset condition,
  switching, in response to the fluctuation meeting the preset condition, the power electronic device from a limited output state to a non-limited output state, wherein
  the fluctuation of the electrical signal parameter at the input terminal is generated by disturbance applied to the input terminal of the power electronic device by the direct-current power supply with disturbance output.

13. The method according to claim 12, wherein the fluctuation meeting the preset condition is that the electrical signal parameter of the input terminal of the power electronic device subject to an abrupt change to a preset range.

14. The method according to claim 12, wherein the fluctuation meeting the preset condition is that the fluctuation of the electrical signal parameter at the input terminal of the power electronic device is in accordance to a preset pattern.

* * * * *